United States Patent
Xu

(10) Patent No.: US 6,761,813 B2
(45) Date of Patent: Jul. 13, 2004

(54) HEAT TRANSFER THROUGH COVALENT BONDING OF THERMAL INTERFACE MATERIAL

(75) Inventor: Youzhi E. Xu, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 10/062,255

(22) Filed: Jan. 31, 2002

(65) Prior Publication Data

US 2003/0143382 A1 Jul. 31, 2003

(51) Int. Cl.$^7$ ................................................. C25D 5/02
(52) U.S. Cl. ..................... 205/114; 205/317; 205/205; 205/414; 361/704; 257/675
(58) Field of Search ................................. 205/114, 317, 205/205, 414; 361/704; 257/675

(56) References Cited

U.S. PATENT DOCUMENTS

| | | | |
|---|---|---|---|
| 5,403,783 A | * | 4/1995 | Nakanishi et al. .......... 438/106 |
| 2002/0132896 A1 | * | 9/2002 | Nguyen ...................... 524/404 |
| 2003/0128521 A1 | * | 7/2003 | Matayabas et al. ......... 361/705 |

OTHER PUBLICATIONS

Mirngh–Ji Lii et al.; Flip–Chip Technology on Organic Pin Grid Array Packages; Intel Technology Journal Q3, 2000; pp. 1–9, no month avail.

Ravi Mahajan et al.; The Evolution of Microprocessor Packaging; Intel Technology Journal Q3, 2000; pp. 1–10, no month avail.

Thomas E. Browne et al.; Polymer–Grafted Silica: A Screening System for Polymeric Adsorption Resin Development; I&EC Research, 1993, 32, American Chemical Society; p. 6, no month avail.

Patric Jannasch; Preparation and studies of ion conducting molecular composites; http://www.polymer.lth.se/Students/Masters Thesis/MasterThesisList/MT03/; Downloaded Dec. 4, 2001; 2 pages.

Thomas Ollila; Selection Criteria for Thermal Interface Materials; http://www.chomerics.com/tech/therm_mgmt_artcls/TIMarticle.pdf; 4 pages, no date avail.

[Report] Polymer Nanocomposites: Introduction: Objective and Purpose of this Report; http://www.the–infoshop.com/study/bc5502_polymer_nanocomposites.html; Downloaded Dec. 10, 2001; 1 page.

Physical Constants of IC Package Materials; 2000 Packaging Databook; http://www.developer.intel.com/design/packtech/ch_05.pdf; pp. 5–1 thru 5–4, no month avail.

Ram Viswanath et al.; Thermal Performance Challenges from Silicon to Systems; Intel Technology Journal Q3, 2000; pp. 1–16, no month avail.

Y.E. Xu et al.; Development and Certification of a Thermal Interface Material for Mobile Coppermine and Cascade 256K Cartridge Packages; Intel Assembly & Test Technology Journal; 1999; vol. 2; pp. 1–5, no month avail.

* cited by examiner

*Primary Examiner*—Wesley A. Nicolas
(74) *Attorney, Agent, or Firm*—Blakely, Sokoloff, Taylor & Zafman LLP

(57) ABSTRACT

A thermal interface material may be covalently bonded to a bottom surface of a heat dissipating device and/or a backside surface of a heat generating device. The heat dissipating device may be thermally coupled to the heat generating device, the thermal interface material disposed between the bottom surface of the heat dissipating device and the backside surface of the heat generating device. The thermal interface material may comprise a polymer material with thermally conductive filler components dispersed therein. For one embodiment, the thermally conductive filler components may be covalently bonded together. For one embodiment, the thermally conductive filler components may be covalently bonded with the polymer material.

23 Claims, 5 Drawing Sheets

HEAT TRANSFER THROUGH COVALENT BONDING OF THERMAL INTERFACE MATERIAL

FIELD OF THE INVENTION

The present invention relates to integrated circuit (IC) package technology and more particularly to improved heat dissipating from integrated circuit packages.

BACKGROUND OF THE INVENTION

As integrated circuits (ICs) become smaller and faster, the amount of heat generated per square inch may increase accordingly. Therefore, one of the challenges presented to IC package designers is to dissipate heat. An IC package typically includes an IC mounted on a package substrate. A heat dissipating device, such as an integrated heat spreader (IHS) or a thermal plate, may be coupled to a backside surface of the IC, in an effort to remove heat from the IC. Imperfections in the mating surfaces of the IC and the heat dissipating device may result in small gaps of air between the devices. Because air is a poor conductor of heat, these gaps may serve as a barrier to heat transfer. A thermal interface material (TIM) with a higher thermal conductivity than air may be disposed between the IC and the heat dissipating device in an effort to fill these gaps and enhance heat transfer.

The TIM is typically made of a polymer material in combination with filler components made of a thermally conductive material, such as metal or ceramic. The polymer material may promote adhesion with the IC and the heat dissipating device and may bind the filler components together. Because the polymer material typically has a low thermal conductivity, the thermally conductive filler components may provide the main path for heat transfer. Therefore, heat transfer may be dependent on physical contact between filler components and the surfaces of the IC and the heat dissipating device, as well as physical contact between adjacent filler components in the bulk TIM.

However, layers of polymer material may prevent direct physical contact between filler components and the surfaces of the IC and the heat dissipating device, which may increase contact thermal resistance at these interfaces. Further, layers of polymer material may also fill gaps between adjacent filler components which may prevent direct physical contact between the surfaces of the adjacent filler components and may increase bulk thermal resistance of the TIM.

DETAILED DESCRIPTION

In the following description, numerous specific details are set forth, such as material types and ranges, in order to provide a thorough understanding of the present invention. However, it will be obvious to one of skill in the art that the invention may be practiced without these specific details. In other instances, well-known elements and processing techniques have not been shown in particular detail in order to avoid unnecessarily obscuring the present invention.

The present invention utilizes covalent bonding to reduce thermal resistance across an interface between a heat generating device, such as an integrated circuit (IC), and a heat dissipating device. For one embodiment, covalent bonds may be formed at an interface between a thermal interface material (TIM) and the heat generating device and/or the heat dissipating device. Covalent bonding may result in stronger bonding between atoms and molecules which may result in more effective heat transfer than may be possible using traditional methods that rely on physical contact for heat transfer. For one embodiment, covalent bonding between thermally conductive filler components and a polymer-based material may also reduce bulk thermal resistance of the TIM.

Figure 1:
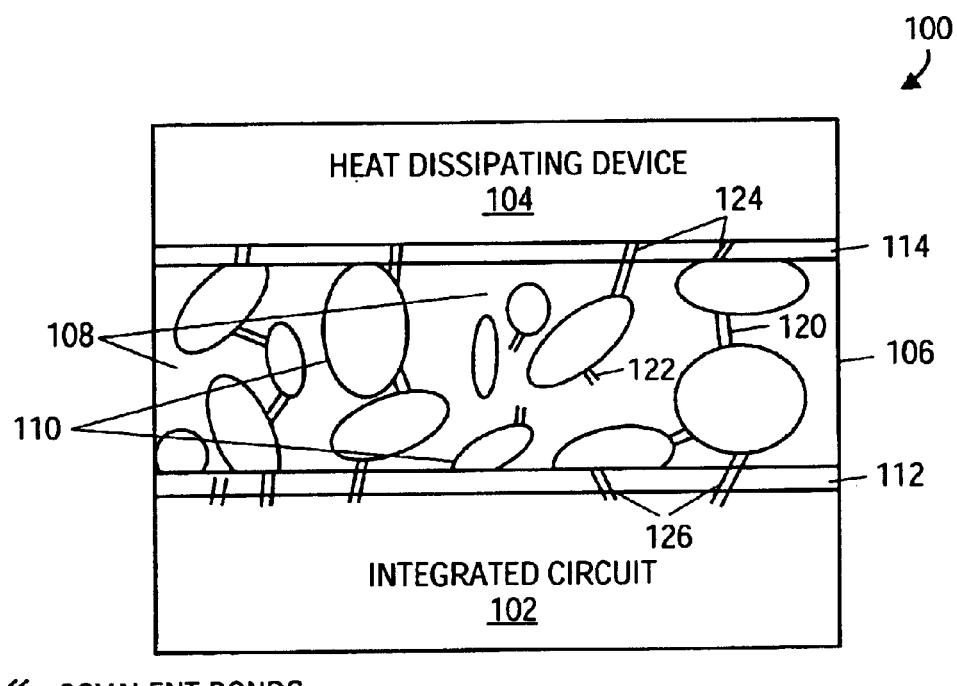
FIG. 1 illustrates an exemplary thermal interface between an integrated circuit (IC) and a heat dissipating device according to one embodiment of the present invention.

FIG. 1 illustrates an exemplary thermal interface 100 between an IC 102 and a heat dissipating device 104, according to one embodiment of the present invention. The heat dissipating device may be any suitable heat dissipating device, such as an integrated heat spreader (IHS), a thermal plate, a heat pipe lid, or a heat sink. The heat dissipating device may be made of any suitable thermally conductive material, such as a metal. For one embodiment, the heat dissipating device may be aluminum or copper. A TIM 106 may be disposed between a backside surface of the IC and a bottom surface of the heat dissipating device to enhance heat flow from the IC to the heat dissipating device. The TIM may be any suitable type TIM, such as a thermal grease, thermal adhesive, a thermal gel, an elastomer, a phase change material, or a thermal gap filler.

As illustrated, the TIM may comprise a polymer material 108 with thermally conductive filler components 110 dispersed therein. Intermediate interfaces 112 and 114 may be formed between the IC and the TIM, and between the TIM and the heat dissipating device, respectively. The total thermal resistance ($\theta_{TOTAL}$) across the interface between the IC and the heat dissipating device may be defined as the sum of the contact thermal resistance at the interface between the IC and the TIM ($\theta_{IC-TIM}$), the bulk thermal resistance of the TIM ($\theta_{BULK}$), and the contact thermal resistance at the interface between the TIM and the heat dissipating device ($\theta_{TIM-HDD}$):

$$\theta_{TOTAL} = \theta_{BULK} + \theta_{IC-TIM} + \theta_{TIM-HDD}.$$

While $\theta_{TOTAL}$ for a typical interface between an IC and a heat dissipating device may usually be in the range of 0.5 to 1.5 cm$^2$ C/W, for one embodiment of the present invention, $\theta_{TOTAL}$ may be less than 0.45 cm$^2$ C/W.

Figure 2:
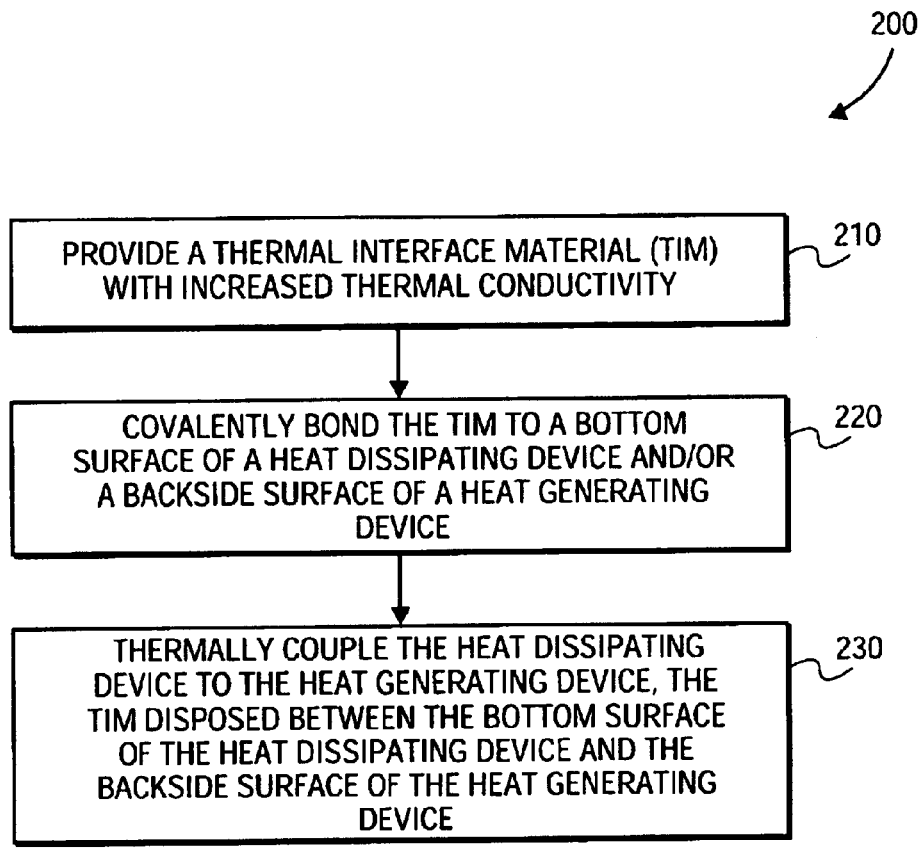
FIG. 2 illustrates a flow diagram according to one embodiment of the present invention.

FIG. 2 illustrates a flow diagram 200 illustrating exemplary operations of a method according to one embodiment of the present invention. The operations of flow diagram 200 may be described with reference to the exemplary embodiment illustrated in FIG. 1. However, it should be understood that the operations of flow diagram 200 may result in embodiments other than the exemplary embodiment of FIG. 1.

For block 210, a TIM with increased thermal conductivity is provided. A TIM with increased bulk thermal conductivity may have reduced bulk thermal resistance due to an inverse relationship between thermal resistance and thermal conductivity. For one embodiment, bulk thermal conductivity may be increased by forming covalent bonds between filler components 110, such as covalent bond 120 and/or by forming covalent bonds between filler components 110 and the polymer material 108, such as covalent bond 122. Covalent bonds may be represented by double lines in FIG. 1.

Examples of TIMs with increased bulk thermal conductivity due to covalent bonding include molecular composites, nanocomposites, thermally conductive polymers, and crystalline polymers. Increased bulk thermal conductivity may be defined as a bulk thermal conductivity greater than 0.5 W/mK. For one embodiment, a TIM may be provided with a bulk thermal conductivity greater than 4 W/mK.

Figure 3:
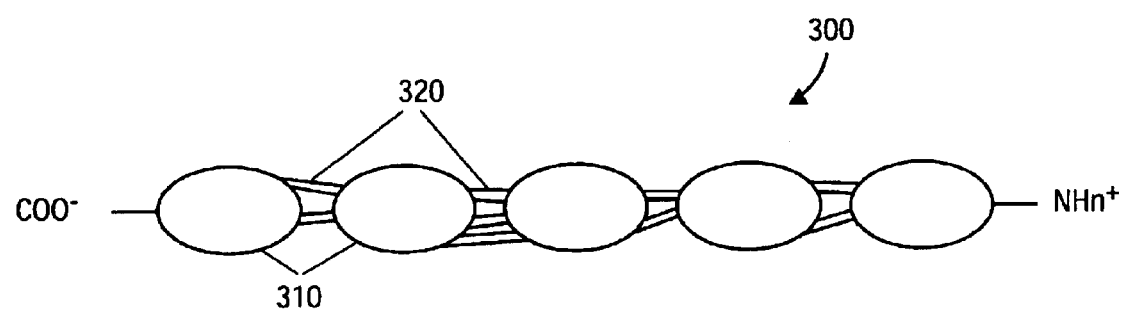
FIG. 3 illustrates an exemplary hybrid polymer according to one embodiment of the present invention.

For one embodiment, a TIM may comprise a molecular composite incorporating a hybrid polymer with covalent bonding between thermally conductive components. For example, FIG. 3 illustrates an exemplary hybrid polymer 300, comprising metal or ceramic filler components 310 with covalent bonds 320 between the filler components. The hybrid polymer may be produced by organometallic or organic/inorganic synthesis.

To produce the TIM, for one embodiment, filler components may be treated to promote covalent bonding with the polymer base material. For example, metal or ceramic filler components may be treated with an oxidizing agent or with a coupling agent, such as silane, to form OH, NH and/or COOH groups, which may react with a polymer material, such as a COOH terminated polymer material.

For block 220 of FIG. 2, the TIM is covalently bonded to a bottom surface of a heat dissipating device and/or a backside surface of a heat generating device. For example, the TIM may be covalently bonded to the bottom surface of the heat dissipating device 102 via covalent bonds 124 and/or the backside surface of the IC 104 via covalent bonds 126. Covalently bonding the TIM may reduce contact thermal resistance at the intermediate interfaces 112 and 114 between the TIM and surfaces of the IC and the heat dissipating device, respectively.

For example, while a typical contact thermal resistance at one of the intermediate interfaces may be in the range of 0.15 to 0.25 $cm^2$ C/W, for one embodiment of the present invention, the sum of the contact thermal resistances at both intermediate interfaces may be less than 0.15 cm C/W. Various processes may be used to covalently bond the TIM to one or both of the surfaces, such as electrodeposition of a polymer or oligomer, electropolymerization of a monomer, surface grafting, and chemical treatment of the surface.

Electrodeposition of an electroactive polymer or oligomer may utilize the heat dissipating device or IC as an electrical conductor or semiconductor. For example, the hybrid polymer 300 illustrated in FIG. 3 may be suitable for electrodeposition onto a metal surface of the heat dissipating device or a silicon surface of the IC. As illustrated, the hybrid polymer may have electroactive end groups, such as $NH_n^+$ and $COO^-$. Positive or negative charges may be introduced at one end of the polymer chain, while discharges from the other end of the polymer chain may be deposited on a surface of the heat dissipating device or IC. Electrodeposition may also produce physical bonding superior to traditional methods of adhesion, which may also reduce contact thermal resistance.

Elecropolymerization may comprise deposition of a monomer on a surface of the IC and/or the heat dissipating device. The monomer may be cyclic or unsaturated. As with electrodeposition, the heat dissipating device and/or the IC may be utilized as an electrical conductor or semiconductor. Free radical, anionic, or cationic species may be generated to initialize chain polymerization of the monomer, which may result in covalent bonding between the polymer and the surface.

Surface graft treatment may also result in covalent bonding at a surface of the IC and/or heat dissipating device. For one embodiment, surface graft polymerization may be applied to a monomer deposited on the surface to be treated. Alternatively, a pre-formed polymer or oligomer may be grafted onto the surface. Suitable grafting techniques are well known in the art.

For one embodiment, a surface of the heat dissipating device and/or the IC may be chemically treated to generate a functional group which may react with the TIM to form covalent bonds. For example, a silicon surface of the IC may be oxidized by an oxidizing agent such as $KMnO_4$, to generate COOH or OH which may react with a polymer-based TIM, such as an epoxy resin. As another example, a surface of the heat dissipating device may be treated to form aluminum oxide ($Al_2O_3$), which may react with a COOH terminated TIM.

For block 230 of FIG. 2, the heat dissipating device is thermally coupled to the heat generating device with the TIM disposed between the bottom surface of the heat dissipating device and the backside surface of the heat generating device. For one embodiment, the TIM may be deposited on the backside surface of the IC and the heat dissipating device may then be coupled to the backside surface of the IC. For another embodiment, the TIM may be applied to the bottom surface of the heat dissipating device and the heat dissipating device may then be coupled to the backside surface of the IC.

For different embodiments, the different treatment processes described above may be combined in various manners. For example, an electroactive polymer may be electrodeposited on the bottom surface of the heat dissipating device, while the backside surface of the IC may be chemically treated to form covalent bonds with the TIM. For another embodiment, treating a surface of only one of the devices may reduce the total thermal resistance enough to satisfy heat dissipating requirements of a package application. Treating only one device may reduce manufacturing costs. For one embodiment, reducing contact resistance may reduce total thermal resistance enough to satisfy heat dissipation requirements without using a TIM with increased bulk thermal conductivity. For another embodiment, using a TIM with increased bulk thermal conductivity may adequately reduce total thermal resistance without reducing contact resistance.

Figure 4:
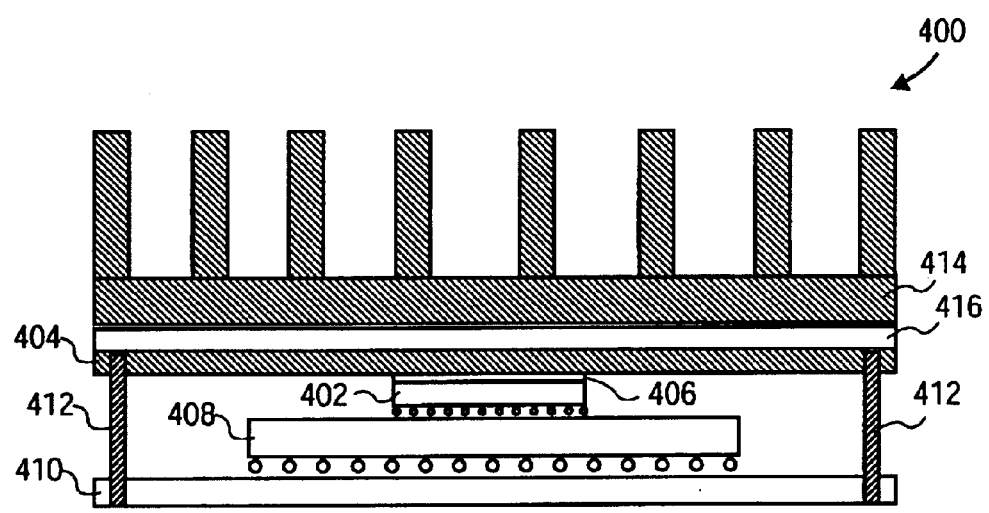
FIG. 4 illustrates an integrated circuit (IC) package according to one embodiment of the present invention.

FIG. 4 illustrates an exemplary IC package 400, according to one embodiment of the present invention. The IC package may be a flip chip package, also known as control collapse chip connection (C4) package, having an IC 402 mounted on a package substrate 408, which may be mounted on a PC board 410. An integrated heat spreader (IHS) 404 may be thermally coupled to a backside surface of the IC with a first TIM 406 disposed between a bottom surface of the IHS and a backside surface of the IC. The IHS maybe mounted on standoffs 412 attached to the PC board. The previously described methods may be applied to reduce the total thermal resistance across the interface between the IC and the IHS.

As illustrated, in an effort to further enhance heat transfer from the IC package, a heat sink 414 may be thermally coupled to a top surface of the IHS. The heat sink may include fins or other protrusions to increase its surface area, which may increase its ability to remove heat from the IC package. A second TIM 416 may be disposed between the top surface of the IHS and a bottom surface of the heat sink. For one embodiment, the previously described methods may be applied to reduce the total thermal resistance across the interface between the IHS and the heat sink.

Figure 5:
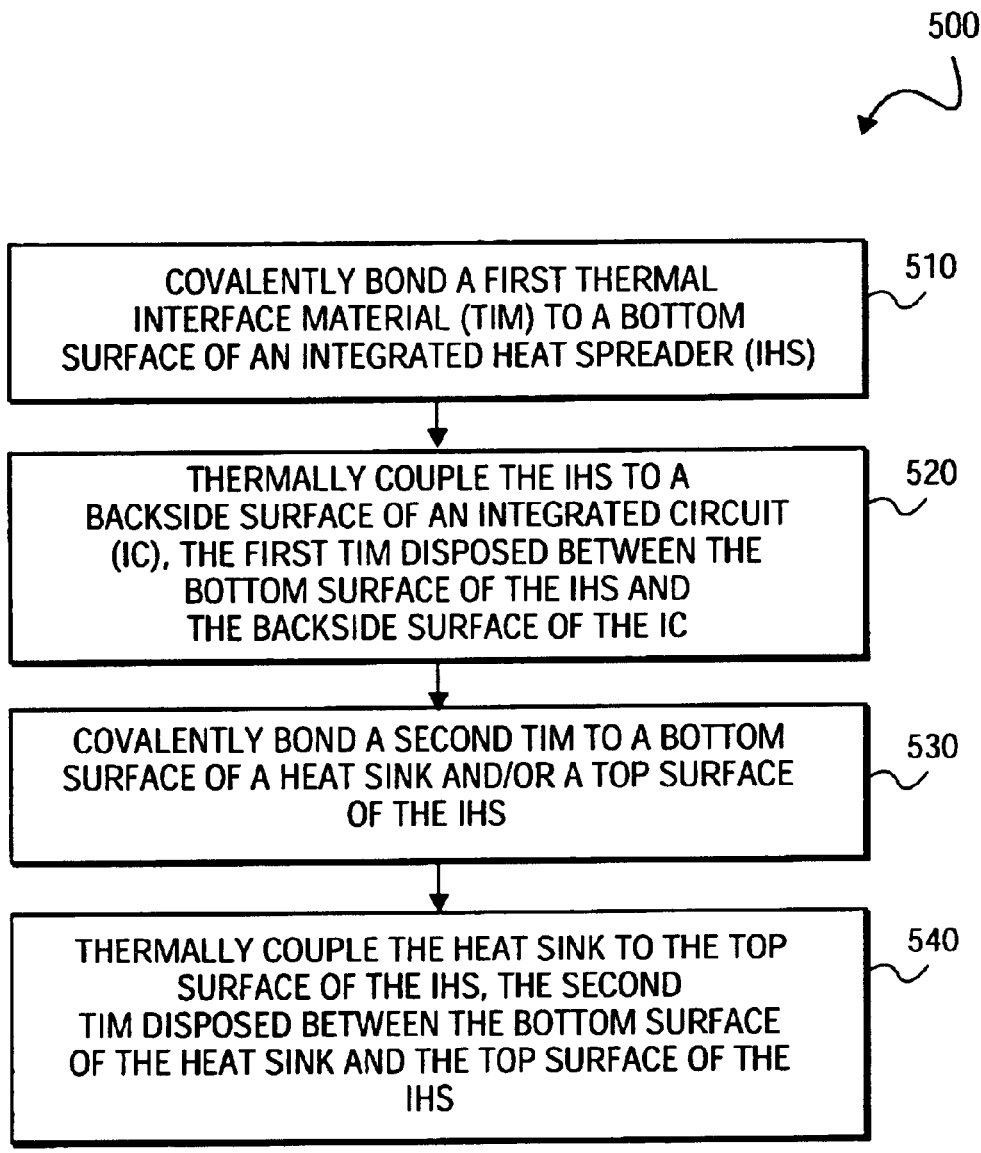
FIG. 5 illustrates a flow diagram according to another embodiment of the present invention.

FIG. 5 illustrates a flow diagram 500 illustrating exemplary operations of a method to fabricate an IC package according to one embodiment. For block 510, a first TIM is covalently bonded to a bottom surface of an IHS. For block 520, the IHS is thermally coupled to a backside surface of an IC, the TIM disposed between the bottom surface of the IHS and the backside surface of the IC. For block 530, a second TIM is covalently bonded to a bottom surface of a heat sink and/or a backside surface of the IHS. For block 540, the heat sink is thermally coupled to the IHS, the second TIM disposed between the bottom surface of the heat sink and the top surface of the IHS.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
    covalently bonding a thermal interface material to a bottom surface of a heat dissipating device and/or a backside surface of a heat generating device using an electrolysis process; and
    thermally coupling the heat dissipating device to the heat generating device, the thermal interface material disposed between the bottom surface of the heat dissipating device and the backside surface of the heat generating device.

2. The method of claim 1, wherein covalently bonding the thermal interface material to a bottom surface of a heat dissipating device and/or a backside surface of a heat generating device using an electrolysis process comprises electropolymerization of a monomer.

3. The method of claim 1, wherein covalently bonding the thermal interface material to a bottom surface of a heat dissipating device and/or a backside surface of a heat generating device using an electrolysis process comprises electrodeposition of an electroactive polymer.

4. The method of claim 3, wherein electrodeposition of an electroactive polymer comprises electrodeposition of an electroactive polymer on a metal surface of the heat dissipating device.

5. The method of claim 3, wherein the electroactive polymer has an electroactive end group —$NH_n^+$.

6. The method of claim 3, wherein the electroactive polymer has an electroactive end group —COOH or —COO—.

7. A method comprising:
    covalently bonding a thermal interface material to a bottom surface of a heat dissipating device and/or a backside surface of a heat generating device further comprising grafting a polymer on the bottom surface of a heat dissipating device and/or a backside surface of a heat generating device; and
    thermally coupling the heat dissipating device to the heat generating device, the thermal interface material disposed between the bottom surface of the heat dissipating device and the backside surface of the heat generating device.

8. A method comprising:
    covalently bonding a thermal interface material to a bottom surface of a heat dissipating device and/or a backside surface of a heat generating device further comprising chemically treating the backside surface of the heat generating device to generate a functional group that can react with the thermal interface material to form covalent bonds; and
    thermally coupling the heat dissipating device to the heat generating device, the thermal interface material disposed between the bottom surface of the heat dissipating device and the backside surface of the heat generating device.

9. The method of claim 8, wherein chemically treating the backside surface of the heat generating device comprises oxidizing a silicon surface of the heat generating device with an oxidizing agent.

10. The method of claim 9, wherein the oxidizing agent is $KMnO_4$, and the thermal interface material comprises an epoxy resin.

11. The method of claim 1, wherein the heat generating device is an integrated circuit and the heat dissipating device is an integrated heat spreader.

12. The method of claim 11, wherein the thermal interface material has a bulk thermal conductivity greater than 4 W/mK.

13. A method comprising:
    covalently bonding, a thermal interface material to a bottom surface of a heat dissipating device and/or a backside surface of a heat generating device by electropolymerization of a monomer; and
    thermally coupling the heat dissipating device to the heat generating device, the thermal interface material disposed between the bottom surface of the heat dissipating device and the backside surface of the heat generating device.

14. The method of claim 13, wherein the heat generating device is an integrated circuit and the heat dissipating device is an integrated heat spreader.

15. The method of claim 13, wherein the thermal interface material has a bulk thermal conductivity greater than 4 W/mK.

16. A method comprising:
    covalently bonding, a thermal interface material to a bottom surface of a heat dissipating device and/or a backside surface of a heat generating device by electrodeposition of an electroactive polymer; and
    thermally coupling the heat dissipating device to the heat generating device, the thermal interface material disposed between the bottom surface of the heat dissipating device and the backside surface of the heat generating device.

17. The method of claim 16, wherein electrodeposition of an electroactive polymer comprises electrodeposition of an electroactive polymer on a metal surface of the heat dissipating device.

18. The method of claim 16, wherein the electroactive polymer has an electroactive end group —$NH_n^+$.

19. The method of claim 16, wherein the electroactive polymer has an electroactive end group —COOH or —COO—.

20. The method of claim 16, wherein the heat generating device is an integrated circuit and the heat dissipating device is an integrated heat spreader.

21. The method of claim 20, wherein the thermal interface material has a bulk thermal conductivity greater than 4 W/mK.

22. A method comprising:

covalently bonding a thermal interface material to a bottom surface of a heat dissipating device and/or a backside surface of a heat generating device by chemically treating the backside surface of the heat generating device with a $KMnO_4$ oxidizing agent to generate a functional group that can react with the thermal interface material to form covalent bonds; and thermally coupling the heat dissipating device to the heat generating device, the thermal interface material disposed between the bottom surface of the heat dissipating device and the backside surface of the heat generating device.

23. The method of claim 22, wherein the thermal interface material comprises an epoxy resin.

* * * * *

UNITED STATES PATENT AND TRADEMARK OFFICE
CERTIFICATE OF CORRECTION

PATENT NO. : 6,761,813 B2  Page 1 of 1
DATED : July 13, 2004
INVENTOR(S) : Xu

It is certified that error appears in the above-identified patent and that said Letters Patent is hereby corrected as shown below:

Column 5,
Line 39, delete "beat" and insert -- heat --.

Signed and Sealed this

Thirtieth Day of November, 2004

JON W. DUDAS
*Director of the United States Patent and Trademark Office*